United States Patent
Hart et al.

[11] Patent Number: 6,154,687
[45] Date of Patent: Nov. 28, 2000

[54] MODIFIED COSINE FILTERS

[75] Inventors: David G. Hart, Raleigh; Damir Novosel; Robert A. Smith, both of Cary, all of N.C.

[73] Assignee: ABB Power T&D Company Inc., Raleigh, N.C.

[21] Appl. No.: 09/060,458

[22] Filed: Apr. 15, 1998

[51] Int. Cl.[7] ............................... H02J 1/14; H02J 3/02; H02J 17/00; H02H 7/00; H02H 9/00
[52] U.S. Cl. .................. 700/294; 700/292; 700/293; 700/297; 700/298; 702/60; 702/75; 702/76; 361/76; 361/80; 361/86; 361/87; 361/88
[58] Field of Search .................... 700/294, 292, 700/293, 297, 298; 702/60, 75, 76, 59, 66, 58, 64, 112, 77; 361/86, 88, 76, 78, 87, 80

[56] References Cited

U.S. PATENT DOCUMENTS

| | | | |
|---|---|---|---|
| 5,172,329 | 12/1992 | Rahman et al. | 364/483 |
| 5,428,549 | 6/1995 | Chen | 700/292 |
| 5,453,903 | 9/1995 | Chow | 361/79 |
| 5,592,393 | 1/1997 | Yalla | 364/492 |
| 5,671,112 | 9/1997 | Hu et al. | 361/86 |
| 5,796,258 | 8/1998 | Yang | 324/522 |
| 5,796,629 | 8/1998 | Calero et al. | 700/292 |
| 5,909,656 | 6/1999 | Yang | 702/77 |
| 5,956,220 | 9/1999 | Novosel et al. | 361/62 |

OTHER PUBLICATIONS

Schweitzer, III, et al., "Filtering for Protective Relays", 19th Annual Western Protective Relay Conference, Spokane, Washington, Oct. 20–22, 1992, 1–24.

Zegarra, "Microprocessor–Based Time–Overcurrent Relay: Development, Simulation, Design and Testing", A Thesis Presented to the Faculty of the Graduate College of Ohio University, Jun., 1979, 1–145.

*Primary Examiner*—Ayaz R. Sheikh
*Assistant Examiner*—Frantz Blanchard Jean
*Attorney, Agent, or Firm*—Woodcock Washburn Kurtz Mackiewicz & Norris LLP

[57] ABSTRACT

A high sample rate cosine filter eliminates DC components by summing them such that they sum to zero. A non-orthogonal cosine filter is also provided. When the cosine filter is applied for N=4 samples per cycle, the samples are separated by 90 degrees. However, at higher sampling rates, it is not necessary to wait for 90 degrees to estimate the phasor value. Non-orthogonal components are used to estimate the phasor value. The time delay associated with the cosine filter is reduced in the process.

19 Claims, 5 Drawing Sheets

6,154,687

MODIFIED COSINE FILTERS

CROSS REFERENCE

The present invention is related to the subject matter disclosed in co-pending application Ser. No. 09/060,508, filed on Apr. 15, 1998 titled "Protective Relay With Improved, Sub-Window Cosine Filter".

FIELD OF THE INVENTION

The present invention relates generally to protective relaying, and more particularly to a microprocessor- or DSP-based protective relay with an improved cosine filter function.

BACKGROUND OF THE INVENTION

Electrical transmission lines and power generation equipment must be protected against faults and consequent short circuits, which can cause a collapse of the power system, equipment damage, and personal injury. It is the function of the protective relays, which monitor AC voltages and currents, to locate line faults and initiate isolation by the tripping of circuit breakers. Protective relays generally perform one or more of the following functions: (a) monitoring the system to ascertain whether it is in a normal or abnormal state; (b) metering, which involves measuring certain electrical quantities for operational control; (c) protection, which typically involves tripping a circuit breaker in response to the detection of a short-circuit condition; and (d) alarming, which provides a warning of some impending problem. Fault location, e.g., is associated with the protection function and involves measuring critical system parameters and, when a fault occurs, quickly making a rough estimate of the fault location and of certain characteristics of the fault so that the power source can be isolated from the faulted line. Thereafter, the system makes a comprehensive evaluation of the nature of the fault.

Modern protective relays employ microprocessors and/or digital signal processors (DSPs) to process the voltage and current waveforms measured on the protected transmission line (the term "transmission line" as employed herein is intended to cover any type of electrical conductor, including high power conductors, feeders, and transformer windings). Such processing may include the computation of a DFT. For example, U.S. Pat. No. 5,592,393, Jan. 7, 1997, titled "Method and System for Providing Protective Relay Functions," describes a system that uses the DFT function to compute instantaneous values of fundamental, second harmonic and fifth harmonic components. U.S. Pat. No. 5,172,329, Dec. 15, 1992, "Microprocessor Digital Protective Relay for Power Transformers," describes a system that uses the DFT function to compute voltage and current phasors.

The conventional DFT exhibits poor performance if the input signal contains a decaying DC component having a continuous frequency spectrum. Therefore, the DC signal component, or offset, is typically filtered out of the input signal before the DFT function is carried out. There are a number of the methods to deal with such DC offset, including the use of (1) a digital mimic circuit, (2) half-cycle and full-cycle compensation, (3) a parallel filter, and (4) a cosine filter. However, certain problems are associated with each of these methods. U.S. patent application Ser. No. 08/811,646, filed Mar. 5, 1997, "Protective Relay With Improved DFT Function," discloses an improved DFT function in which the decaying DC components are subtracted from the normal current and voltage phasors to yield modified phasors that are free of the effects of the decaying DC components. The present invention is directed to an alternative approach involving the use of an improved cosine filter.

Since distance relaying involves the use of voltage and current phasors to determine whether a fault is in the protected zone, it is important that the phasor estimates be as accurate as possible. The voltage signal may contain high-frequency components that can be filtered using an anti-aliasing filter and through least squares methods such as the DFT. However, the current may contain a decaying DC component that will cause the DFT to calculate the current phasor erroneously. The current phasor estimate will typically be inflated and, therefore, the ratio of the voltage to the current will yield an impedance value that is too small, causing the relay to trip when the fault is actually beyond the relay setting. (This phenomenon is known as relay "overreach" since the relay reaches beyond its setting and trips.)

Those skilled in the art recognize that the cosine filter provides one mechanism for removing the DC component of the current and thereby improving the current phasor estimate. Unlike the DFT, the cosine filter produces only estimates of the cosine component (i.e., the projection onto the real axis) of the current phasor. The complete phasor may be obtained by using two estimates shifted by 90 degrees, yielding the cosine and sine components. The cosine filter has been demonstrated for four samples per 60 Hz cycle. The object of the cosine filter is to sum the DC component such that it sums to zero. This concept can be extended to higher sampling rates.

SUMMARY OF THE INVENTION

Accordingly, a primary object of the present invention is to provide an improved cosine filter and protective relay utilizing the improved cosine filter. The invention is especially intended for protective relaying applications, such as distance relaying, in which accurate voltage and current phasors must be derived.

According to a presently preferred embodiment of the invention, a phasor representation of a current or voltage waveform on a transmission line is derived by way of a cosine filter. The waveform is presumed to include a decaying DC component that is filtered out to yield a more accurate phasor. The inventive method includes the steps of measuring time-domain samples $s_k$ of the waveform; employing a cosine filter to obtain a first cosine term, and then, less than a quarter-cycle later, obtaining a second cosine term C2; computing a phasor representation of the waveform on the basis of C1 and C2; and finally performing a prescribed power system or protective relaying function using the phasor. The prescribed relaying function may include, e.g., fault typing and/or fault location, although many other applications for phasors are known.

Other features of the invention are disclosed below.

BRIEF DESCRIPTION OF THE DRAWINGS

FIG. 3A is a graph of offset angle versus error for N=4. This graph shows that a correct offset for N=4 is 45 degrees; FIG. 3B is a similar graph for the case where N=8, showing that a correct offset angle is 22.5 degrees; and FIG. 3C is a graph for the case where N=32, showing that a correct angle is 5.625 degrees.

FIG. 4A depicts how the cosine filter yields the projection of the phasor onto the real axis, and FIG. 4B shows how multiple real axis projections may be used to calculate the phasor without first determining the sine component.

DETAILED DESCRIPTION OF PREFERRED EMBODIMENTS

Figure 1:
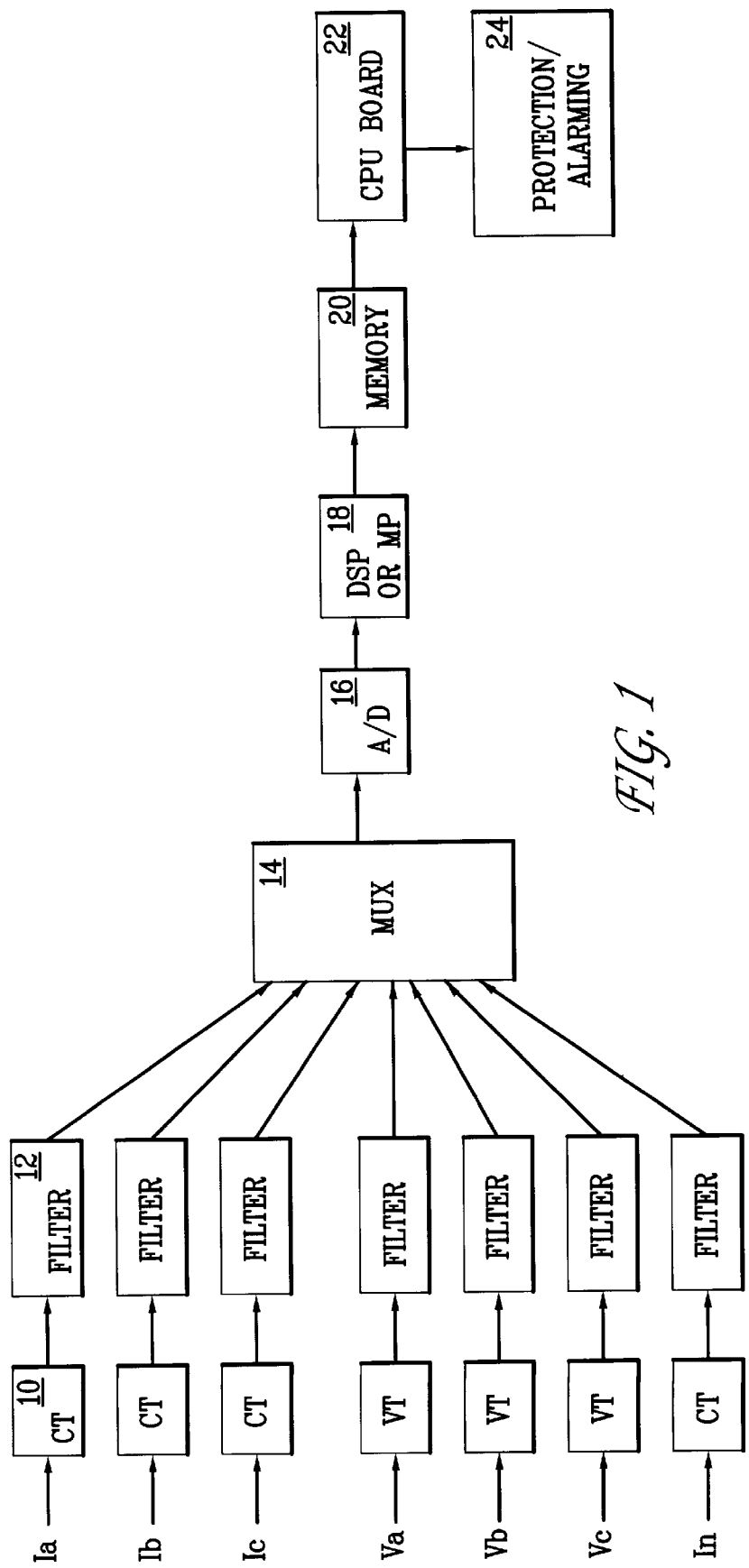
FIG. 1 schematically depicts a protective relay.

FIG. 1 depicts one presently preferred embodiment of a microprocessor-based protective relay in accordance with the present invention. As shown, the relay comprises current and voltage transducers 10, filters 12, and a multiplexer 14, the latter outputting an interleaved stream of analog phase current and voltage signal samples, as well as neutral current samples. The analog multiplex output by the multiplexer 14 is digitized by an analog-to-digital converter 16. The output of the analog-to-digital converter 16 is fed to a DSP 18. The DSP 18 employs a cosine filter, described below, to produce phasor data for each of the sampled channels. The phasor data is stored in a memory 20. The phasor data in the memory 20 is fed via a data bus to a central processing unit (CPU) board 22. The CPU board 22 includes a microprocessor, random access memory, and read only memory (ROM). The ROM contains program code for controlling the microprocessor in performing fault typing, fault location, reporting, and other protective relaying functions. The random access memory may include a pre-fault segment of memory and a post-fault segment of memory, which may be employed (as described, e.g., in U.S. Pat. No. 5,428,549, Jun. 27, 1995, "Transmission Line Fault Location System") in performing the various protective relaying functions. The CPU board 22 may output fault data to a protection/alarming block 24 that performs protection and alarming functions such as tripping a circuit breaker or sounding an alarm as appropriate.

Figure 2:
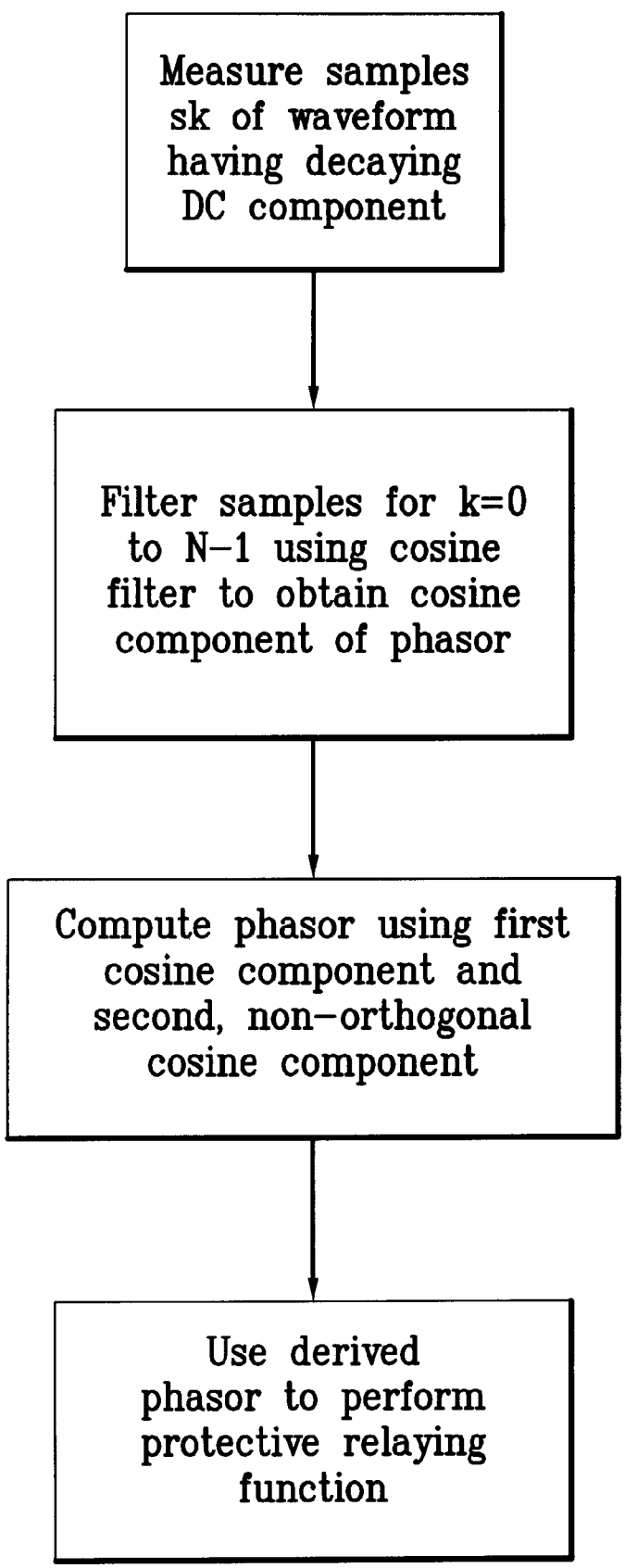
FIG. 2 is a flowchart of a cosine filtering process in accordance with the present invention.

FIG. 2 is a flowchart of a method for deriving a phasor representation of a waveform in accordance with the present invention. As shown, the invention may be viewed as comprising the steps of: measuring time-domain samples $s_k$ of the waveform; filtering the samples to obtain a first cosine component (using samples k=0 to k=N−1) and a second, non-orthogonal cosine component; computing the phasor on the basis of the first and second cosine components; and, finally, performing a prescribed protective relaying function using the phasor. If an orthogonal sine component is used instead of a second, non-orthogonal cosine component per the present invention, a quarter-cycle delay would be required to obtain additional samples. On the other hand, it is not necessary to sample the waveform for another quarter cycle if a second cosine component is used. This is a significant advantage of the present invention.

As mentioned, a primary purpose of the present invention is to eliminate the effect of DC decaying transients on phasor estimates. This may be accomplished using (1) existing cosine filters with higher sampling rates, and (2) a new cosine filter with a shorter window.

High Sampling Rate Cosine Filter

The cosine filter has been demonstrated for 4 samples per cycle (as discussed above). This earlier method shows that the benefit of the cosine filter is that it filters out the DC component (i.e., it sums to zero). This concept can be extended to higher sampling rates. The challenge is to select a cosine filter offset angle δ such that the DC ramp input sums to zero. This is formulated as, $$A \cos(\theta) = \frac{\sqrt{2}}{N} \sum_{k=0}^{N-1} s_k \cos(k\psi + \delta)$$

We want this equation to sum to zero when the input is a DC ramp (approximated below by C+kB)), i.e., $$error = \sum_{k=0}^{N-1} s_k \cos(k\psi + \delta) = \sum_{k=0}^{N-1} (C + kB)\cos(k\psi + \delta)$$

$$= \sum_{k=0}^{N-1} C \cos(k\psi + \delta) + \sum_{k=0}^{N-1} kB \cos(k\psi + \delta)$$

$$error = 0 + \sum_{k=0}^{N-1} kB \cos(k\psi + \delta) = 0$$

Thus, the requirement is that:

$$error = \sum_{k=0}^{N-1} k \cos(k\psi + \delta) = 0$$

Figure 3A:
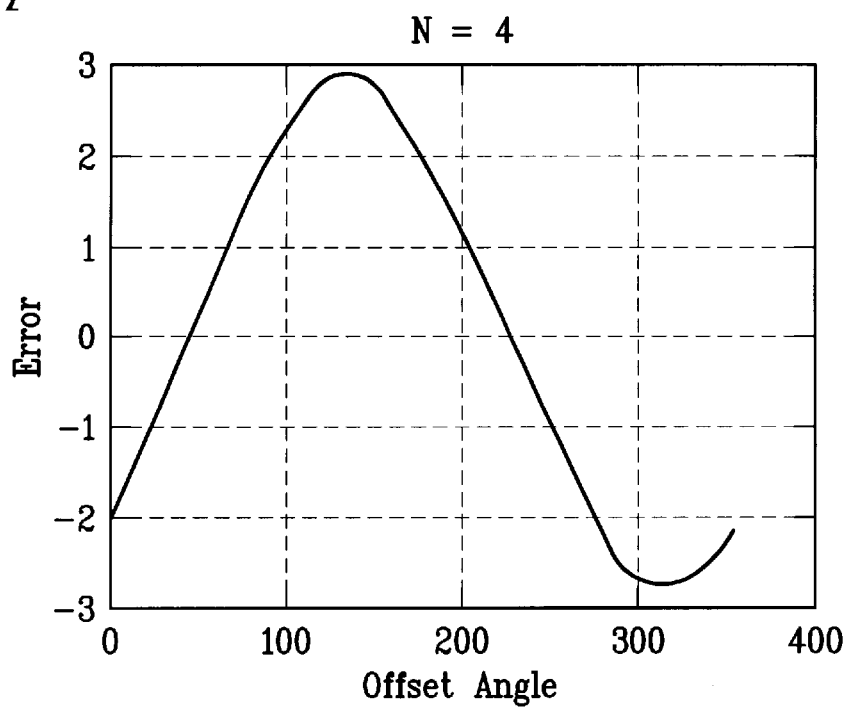
FIGS. 3A, 3B, and 3C are plots of calculated error versus offset angle δ for N=4, 8 and 32, respectively.
Figure 3B:
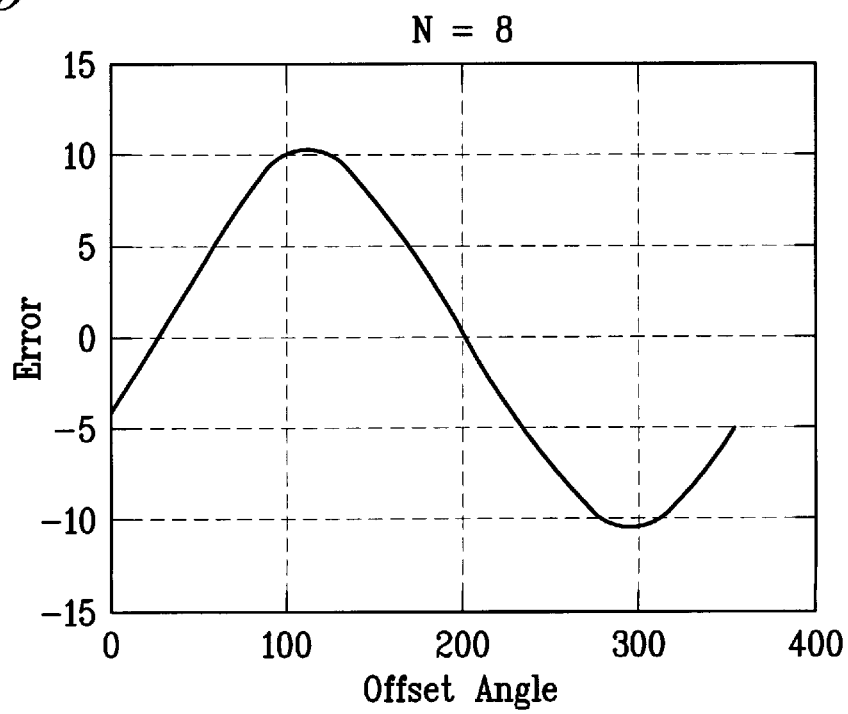
Figure 3C:
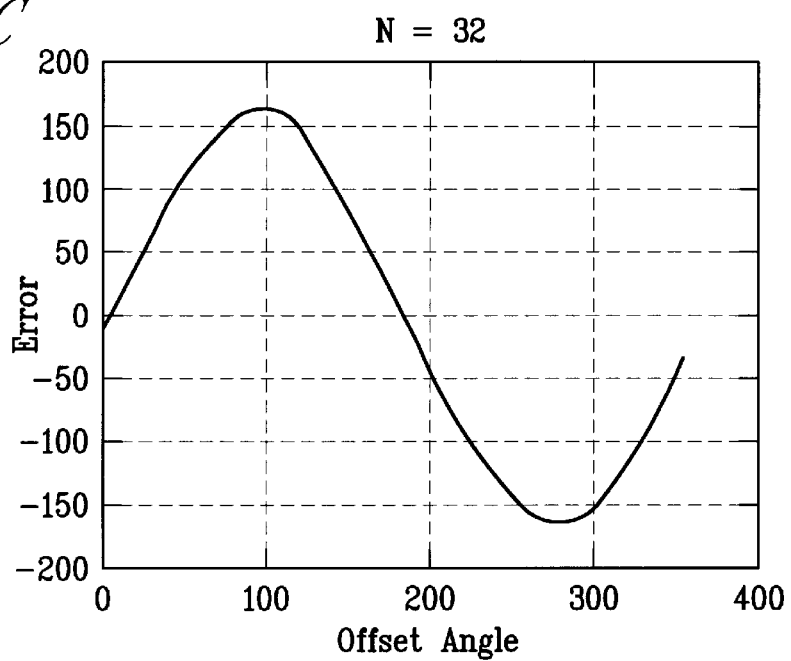

For a fixed number of samples per cycle, or N, the above equation can be plotted. For N=4, the plot is shown in FIG. 3A. The correct offset for N=4 is 45 degrees (or the offset angle corresponding to the other zero crossing), as shown. For the case where N=8, the correct offset angle is 22.5 degrees, as shown in FIG. 3B. For the case of N=32, the correct angle is 5.625 degrees, as shown in FIG. 3C.

The error can be represented mathematically to determine the optimal offset angle. The offset angle δ in degrees for any N-point cosine filter can be proven to be

δ=180/N.

This is a new equation relating the cosine filter to the sampling frequency. It is interesting to note that for a 90 degree phase shift in the error plot (sine term), the error is a maximum. Thus, if the DFT is applied with the offset angle, the cosine term has no error and the sine term has maximum error. It should also be noted that the error is higher for the higher sampling rates, and so it is especially important to use the correct offset angle at the higher sampling rates.

Non-Orthogonal Cosine Filter

When the cosine filter is applied for N=4 samples per cycle, the samples are separated by 90 degrees. Thus, when the next sample is received, it may be used to compute the cosine component shifted by 90 degrees, which is the orthogonal sine component of the DFT. However, at higher sampling rates, where adjacent samples are separated by less than 90 degrees, it is not necessary to wait for 90 degrees to estimate the phasor value. In other words, non-orthogonal components can be used to estimate the phasor value. This is particularly important in reducing the time delay associated with the cosine filter.

Figure 4A:
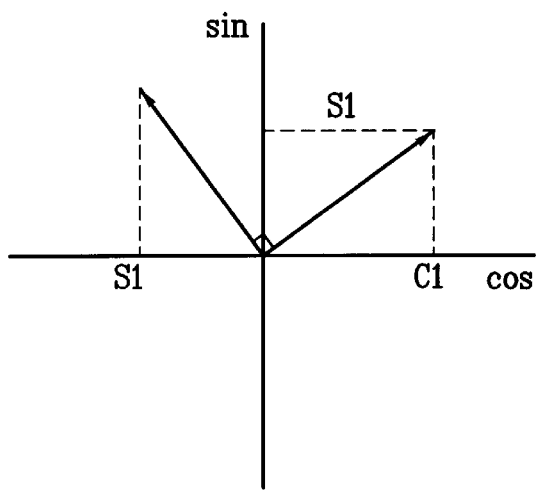
FIGS. 4A and 4B are exemplary phasor diagrams used to explain the inventive non-orthogonal cosine filter.
Figure 4B:
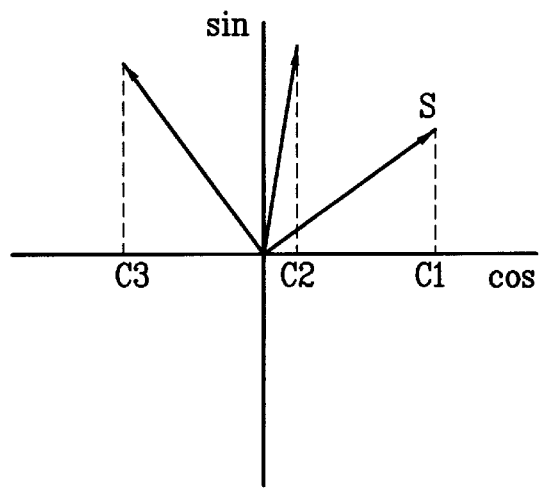

As discussed above and as shown in FIG. 4A, the cosine filter estimates the phasor's cosine component C1. This can be visualized as the projection of the phasor onto the cosine axis (the horizontal axis). By waiting a full quarter-cycle, the sine component S1 corresponding to C1 is rotated such that it is projected onto the cosine axis and will be estimated by the cosine filter. The complete phasor is then obtained from C1 and S1, i.e., the phasor's magnitude is given by $(C1^2+S1^2)^{1/2}$. This process requires one and one-quarter cycle to complete since one full cycle is needed to obtain C1 and then an additional quarter-cycle is needed to obtain S1. However, when cosine estimates are obtained between the two components (C1 and S1) shown in FIG. 4A, it is possible to use these estimates to calculate the phasor without waiting the additional quarter-cycle to obtain S1. This process is illustrated in FIG. 4B.

This process will now be demonstrated for 8 samples per cycle (with adjacent samples separated by 45 degrees), but can be applied to any sampling frequency. The output of the cosine filter at samples 0, 1 and 2 are defined as C1, C2, and C3, respectively, and are the real components of the phasor at each instant. Let the phasor "S" be equal to $X_1+jX_2$ at sample 0, where C1 equals $X_1$ and C2 equals the real component of the phasor rotated by 45 degrees, i.e., $C2=X_1\cos(45°)-X_2\sin(45°)$. Using the values of C1 and C2 provided by the cosine filter, the unknown $X_2$ can be estimated after sample 1 by solving for C2 using C1: $X_2=(C1\cos(45°)-C2)/\sin(45°)$. If more points are used, a system of equations can be defined. This results in a least squares solution for the phasor S. The least squares non-orthogonal (LSNO) filter will further reduce any errors in the phasor estimate. This new algorithm will respond as well as the cosine filter, will reject DC components, and offers increased speed. It should also be noted that the phasor S may have an offset angle due to an offset in the cosine filter. However, this offset angle will typically be known and can be subtracted from the computed angle of the phasor.

Two examples will now be presented to more fully explain the non-orthogonal cosine filter and to distinguish it from the orthogonal cosine filter.

EXAMPLE 1

Figure 5A:
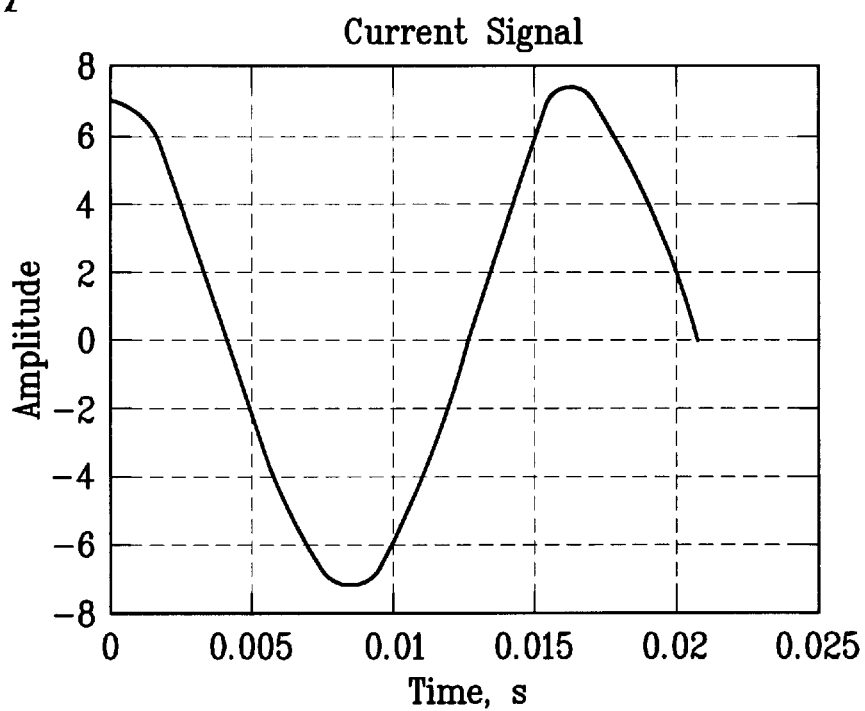
FIGS. 5A and 5B depict exemplary current waveforms used in connection with examples 1 and 2, presented below, to explain the non-orthogonal cosine filter.

In this example, $s_k=[7.07, 5, 0, -5, 0, 5, 7.07, 5]$, where k=0:9 and N=8. This waveform is depicted in FIG. 5A. The "normal" orthogonal cosine filter will first be demonstrated, and then the non-orthogonal cosine filter will be shown.

A. Normal Cosine Filter ($\delta=90°$)

$$C1 = \frac{\sqrt{2}}{N}\sum_{k=0}^{N-1} S_k\cos\left(k2\frac{\pi}{N}\right) = \frac{\sqrt{2}}{8}\sum_{k=0}^{7} S_k\cos\left(k\frac{\pi}{4}\right)$$

$$= \frac{\sqrt{2}}{8}\left[(7.07)(1) + 5\frac{\sqrt{2}}{2} + 0 + (-5)\left(-\frac{\sqrt{2}}{2}\right) + (-7.07)(-1) + (-5)\left(-\frac{\sqrt{2}}{2}\right) + 0 + 5\frac{\sqrt{2}}{2}\right]$$

$$= \underline{5}$$

$$C2 = \frac{\sqrt{2}}{N}\sum_{k=\frac{N}{4}}^{N+\frac{N}{4}-1} S_k\cos\left(\left(k-\frac{N}{4}\right)2\frac{\pi}{N}\right) = \frac{\sqrt{2}}{8}\sum_{k=2}^{9} S_k\cos\left((k-2)\frac{\pi}{4}\right)$$

$$= \frac{\sqrt{2}}{8}\left[0 + (-5)\frac{\sqrt{2}}{2} + 0 + (-5)\left(-\frac{\sqrt{2}}{2}\right) + 0 + (-5)\left(-\frac{\sqrt{2}}{2}\right) + 0 + 5\frac{\sqrt{2}}{2}\right] = \underline{0}$$

$$\vec{S} = C1 - jC2 = \underline{5+j0}$$

B. Non-orthogonal Cosine Filter ($\delta=45°$)

$$C1 = X1 = \underline{5}$$

$$C2 = \frac{\sqrt{2}}{N}\sum_{k=\frac{N}{8}}^{N+\frac{N}{8}-1} S_k\cos\left(\left(k-\frac{N}{8}\right)2\frac{\pi}{N}\right) = \frac{\sqrt{2}}{8}\sum_{k=1}^{8} S_k\cos\left((k-1)\frac{\pi}{4}\right)$$

$$= \frac{\sqrt{2}}{8}\left[(5)(1) + 0 + 0 + (-7.07)\left(-\frac{\sqrt{2}}{2}\right) + (-5)(-1) + 0 + 0 + 7.07\frac{\sqrt{2}}{2}\right] = \underline{3.5355}$$

$$X2 = \frac{C1\cos(\delta) - C2}{\sin(\delta)} = \frac{5\cos(45) - 3.5355}{\sin(45)} = \underline{0}$$

$$\vec{S} = X1 + jX2 = \underline{5+j0}$$

Thus, the non-orthogonal and orthogonal cosine filters yield the same numerical result, but the non-orthogonal cosine filter has the advantage of requiring less time since it does not require a full one and one-quarter cycles worth of samples.

EXAMPLE 2

Figure 5B:
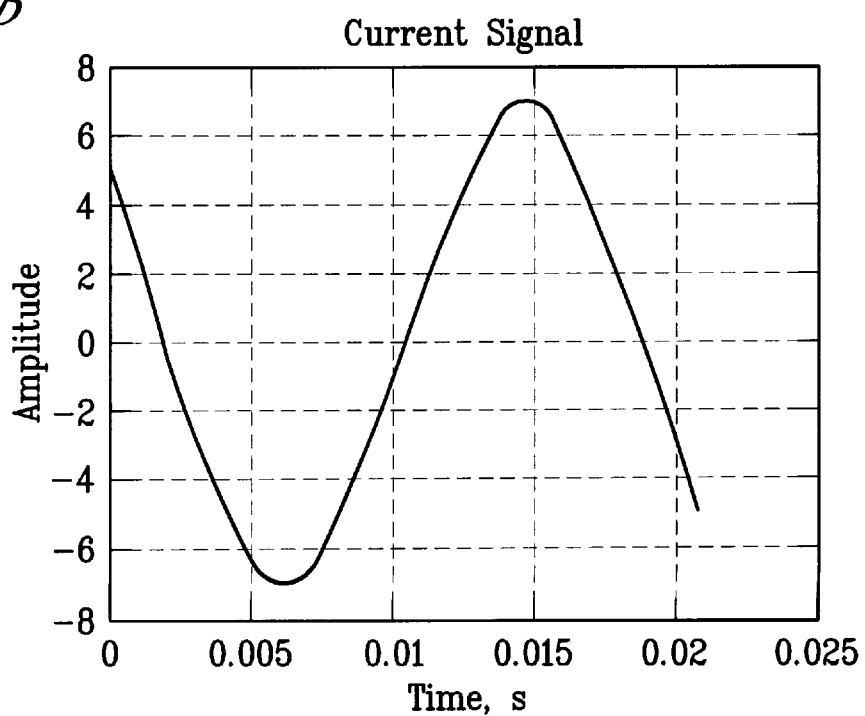

In this example, $s_k=[5, 0, -5, -7.07, -5, 0, 5, 7.07, 5, 0]$, where again k=0:9 and N=8. This waveform is depicted in FIG. 5B.

A. Normal Cosine Filter ($\delta=90°$)

$$C1 = \frac{\sqrt{2}}{N}\sum_{k=0}^{N-1} S_k\cos\left(k2\frac{\pi}{N}\right) = \frac{\sqrt{2}}{8}\sum_{k=0}^{7} S_k\cos\left(k\frac{\pi}{4}\right)$$

$$= \frac{\sqrt{2}}{8}\left[(5)(1) + 0 + 0 + (-7.07)\left(-\frac{\sqrt{2}}{2}\right) + (-5)(-1) + 0 + 0 + 7.07\frac{\sqrt{2}}{2}\right] = \underline{3.5355}$$

$$C2 = \frac{\sqrt{2}}{N}\sum_{k=\frac{N}{4}}^{N+\frac{N}{4}-1} S_k\cos\left(\left(k-\frac{N}{4}\right)2\frac{\pi}{N}\right) = \frac{\sqrt{2}}{8}\sum_{k=2}^{9} S_k\cos\left((k-2)\frac{\pi}{4}\right)$$

$$= \frac{\sqrt{2}}{8}\left[(-5)(1) + (-7.07)\frac{\sqrt{2}}{2} + 0 + 0 + (5)(-1) + 7.07\left(-\frac{\sqrt{2}}{2}\right) + 0 + 0\right] = \underline{-3.5355}$$

$$\vec{S} = C1 - jC2 = \underline{3.5355 + j3.5355}$$

B. Non-orthogonal Cosine Filter ($\delta=45°$)

$$C1 = X1 = \underline{3.5355}$$

-continued $$C2 = \frac{\sqrt{2}}{N} \sum_{k=\frac{N}{8}}^{N+\frac{N}{8}-1} S_k \cos\left(\left(k - \frac{N}{8}\right)2\frac{\pi}{N}\right) = \frac{\sqrt{2}}{8} \sum_{k=2}^{8} S_k \cos\left((k-1)\frac{\pi}{4}\right)$$

$$= \frac{\sqrt{2}}{8}\left[0 + (-5)\frac{\sqrt{2}}{N} + 0 + (-5)\left(-\frac{\sqrt{2}}{2}\right) + 0 + 5\left(-\frac{\sqrt{2}}{2}\right) + 0 + 5\frac{\sqrt{2}}{2}\right] = \underline{3.5355}$$

$$X2 = \frac{C1\cos(\delta) - (C2)}{\sin(\delta)} = \frac{3.5355\cos(45) - 0}{\sin(45)} = \underline{0}$$

$$\vec{S} = X1 + jX2 = \underline{3.5355 + j3.5355}$$

Again, this example shows that the non-orthogonal and orthogonal cosine filters yield the same numerical result but that the non-orthogonal cosine filter requires less time to complete.

Those skilled in the protective relaying art will recognize that there are a variety of uses for phasors of the kind yielded by the present invention. For example, phasors are used in power system protection (e.g., level detection (threshold units), direction discrimination, fault distance estimation, out of step detection, and fault location). Phasors are also used in the fields of power measurement (voltage, current and power metering), power flow analysis, state estimation, and power system control. Voltage and current phasors, e.g., are essential to carrying out many different calculation and decision making processes in the frequency domain. Since errors in the phasor calculations can result in erroneous decisions, it is important that the phasors used in the decision making process be accurate. The present invention provides such accurate phasors.

The above description of preferred embodiments of the invention is not intended to limit the scope of protection of the following claims. Thus, for example, except where they are expressly so limited, the claims are not limited to applications involving three-phase power systems or power systems employing a 60 Hz or 50 Hz fundamental frequency. Moreover, the claims are not limited to systems associated with any particular part (i.e., transformer, feeder, high power transmission line, etc.) of a power distribution system.

We claim:

1. A method for deriving a phasor representation of a current or voltage waveform on a power line, comprising the steps of:
   (a) measuring time-domain samples $s_k$ of said waveform;
   (b) employing a cosine filter to obtain a first cosine term C1 on the basis of the sample $s_k$, k=0 to N−1, wherein N is a predetermined number;
   (c) measuring an additional sample $s_k$ for k=N, wherein said additional sample is obtained less than a quarter-cycle after $s_{N-1}$ is obtained;
   (d) employing the cosine filter to obtain a second cosine term C2 based on at least said additional sample;
   (e) computing a phasor representation of said waveform on the basis of C1 and C2; and
   (f) performing a prescribed power system function using said phasor.

2. A method as recited in claim 1, wherein said waveform includes a decaying DC component.

3. A method as recited in claim 1, wherein said prescribed power system function comprises a member of a group of functions consisting of:

level detection for threshold units, direction discrimination, fault distance estimation, out of step detection, and fault location.

4. A method as recited in claim 1, wherein said prescribed power system function comprises a member of a group consisting of:
   voltage, current and power metering;
   power flow analysis;
   state estimation; and
   power system control.

5. A method as recited in claim 1, wherein:
   (1) said waveform includes a decaying DC component;
   (2) said prescribed power system function comprises a member of a group of functions consisting of:
      level detection for threshold units;
      direction discrimination;
      fault distance estimation;
      out of step detection;
      fault location;
      voltage, current and power metering;
      power flow analysis;
      state estimation; and
      power system control;
   (3) said first cosine term C1 is of the form, $$C1 = \frac{\sqrt{2}}{N} \sum_{k=0}^{N-1} s_k \cos(k\psi + \delta)$$

wherein N is the number of samples per cycle, $\psi$ is the angle between samples and $\delta$ is a predetermined offset angle;

(4) said phasor is computed on the basis of C1 and C2 as follows:

$$\vec{S} = X1 + jX2$$
$$X1 = C1$$
$$X2 = \frac{C1\cos(\delta) - C2}{\sin(\delta)};$$

(5) C2 is computed as follows:

$$C2 = \frac{\sqrt{2}}{N} \sum_{k=1}^{N} S_k \cos\left((k-1)\frac{2\pi}{N}\right);$$

(6) $\delta = 180°/N$.

6. A method for deriving a phasor representation of a current or voltage waveform on a power line, comprising the steps of:
   (a) measuring time-domain samples sk of said waveform;
   (b) employing a cosine filter to obtain a first cosine term C1 on the basis of the sample sk, k=0 to N−1, wherein N is a predetermined number and wherein said first cosine term C1 is of the form, $$C1 = \frac{\sqrt{2}}{N} \sum_{k=0}^{N-1} s_k \cos(k\psi + \delta)$$

(c) measuring an additional sample sk for k=N, wherein said additional sample is obtained less than a quarter-cycle after sN−1 is obtained;

(d) employing the cosine filter to obtain a second cosine term C2 based on at least said additional sample;

(e) computing a phasor representation of said waveform on the basis of C1 and C2; and (f) performing a prescribed power system function using said phasor.

7. A method as recited in claim 6, wherein said phasor is computed on the basis of C1 and C2 as follows:

$$\vec{S} = X1 + jX2$$
$$X1 = C1$$
$$X2 = \frac{C1\,\cos(\delta) - C2}{\sin(\delta)}.$$

8. A method as recited in claim 7, wherein C2 is computed as follows:

$$C2 = \frac{\sqrt{2}}{N}\sum_{k=1}^{N} S_k \cos\left((k-1)\frac{2\pi}{N}\right).$$

9. A method as recited in claim 7, wherein $\delta = 180°/N$.

10. A protective relaying system for use in connection with a power system in deriving a phasor representation of a current or voltage waveform on a power line, comprising:

(a) means for measuring time-domain samples $s_k$ of said waveform;

(b) means for employing a cosine filter to obtain a first cosine term C1 on the basis of the sample $s_k$, k=0 to N−1, wherein N is a predetermined number;

(c) means for measuring an additional sample $s_k$ for k=N, wherein said additional sample is obtained less than a quarter-cycle after $s_{N-1}$ is obtained; and (d) means for employing the cosine filter to obtain a second cosine term C2 based on at least said additional sample; and (e) means for computing a phasor representation of said waveform on the basis of C1 and C2.

11. A system as recited in claim 10, and further comprising means for performing a prescribed power system function using said phasor.

12. A system as recited in claim 11, wherein said prescribed power system function comprises a member of a group of functions consisting of:

level detection for threshold units, direction discrimination, fault distance estimation, out of step detection, and fault location.

13. A system as recited in claim 11, wherein said prescribed power system function comprises a member of a group consisting of:

voltage, current and power metering;
power flow analysis;
state estimation;
and power system control.

14. A system as recited in claim 11, wherein:

(1) said waveform includes a decaying DC component;

(2) said prescribed power system function comprises a member of a group of functions consisting of:
level detection for threshold units;
direction discrimination;
fault distance estimation;
out of step detection;
fault location;
voltage, current and power metering;
power flow analysis;
state estimation; and
power system control;

(3) said first cosine term C1 is of the form, $$C1 = \frac{\sqrt{2}}{N}\sum_{k=0}^{N-1} s_k \cos(k\psi + \delta)$$

wherein N is the number of samples per cycle, $\psi$ is the angle between samples and $\delta$ is a predetermined offset angle;

(4) said phasor is computed on the basis of C1 and C2 as follows:

$$\vec{S} = X1 + jX2$$
$$X1 = C1$$
$$X2 = \frac{C1\cos(\delta) - C2}{\sin(\delta)};$$

(5) C2 is computed as follows:

$$C2 = \frac{\sqrt{2}}{N}\sum_{k=1}^{N} S_k \cos\left((k-1)\frac{2\pi}{N}\right);$$

(6) $\delta = 180°/N$.

15. A system as recited in claim 10, wherein said waveform includes a decaying DC component.

16. A system as recited in claim 10, wherein said first cosine term C1 is of the form, $$C1 = \frac{\sqrt{2}}{N}\sum_{k=0}^{N-1} s_k \cos(k\psi + \delta)$$

wherein N is the number of samples per cycle, $\psi$ is the angle between samples and $\delta$ is a predetermined offset angle.

17. A system as recited in claim 16, wherein $\delta = 180°/N$.

18. A protective relaying system for use in connection with a power system in deriving a phasor representation of a current or voltage waveform on a power line, comprising:

(a) means for measuring time-domain samples $s_k$ of said waveform;

(b) means for employing a cosine filter to obtain a first cosine term C1 on the basis of the sample $s_k$, k=0 to N−1, wherein N is a predetermined number and wherein said first cosine term C1 is of the form, $$C1 = \frac{\sqrt{2}}{N}\sum_{k=0}^{N-1} s_k \cos(k\psi + \delta)$$

wherein N is the number of samples per cycle, $\psi$ is the angle between samples and $\delta$ is a predetermined offset angle;

(c) means for measuring an additional sample $s_k$ for k=N, wherein said additional sample is obtained less than a quarter-cycle after $S_{N-1}$ is obtained; and (d) means for employing the cosine filter to obtain a second cosine term C2 based on at least said additional sample; and (e) means for computing a phasor representation of said waveform on the basis of C1 and C2 as follows:

$$\vec{S} = X1 + jX2$$
$$X1 = C1$$
$$X2 = \frac{C1\cos(\delta) - C2}{\sin(\delta)}.$$

19. A system as recited in claim 18, wherein C2 is computed as follows:

$$C2 = \frac{\sqrt{2}}{N}\sum_{k=1}^{N} S_k \cos\left((k-1)\frac{2\pi}{N}\right).$$

\* \* \* \* \*